(12) United States Patent
Kirsten (10) Patent No.: US 6,819,004 B2
(45) Date of Patent: Nov. 16, 2004

(54) ENCAPSULANT WITH FLUXING PROPERTIES AND METHOD OF USE IN FLIP-CHIP SURFACE MOUNT REFLOW SOLDERING

(75) Inventor: Kenneth John Kirsten, Streamwood, IL (US)

(73) Assignee: Kac Holdings, Inc., Des Plaines, IL (US)

( * ) Notice: Subject to any disclaimer, the term of this patent is extended or adjusted under 35 U.S.C. 154(b) by 0 days.

(21) Appl. No.: 10/361,390

(22) Filed: Feb. 10, 2003

(65) Prior Publication Data

US 2003/0175521 A1 Sep. 18, 2003

Related U.S. Application Data

(60) Division of application No. 08/644,912, filed on May 28, 1996, which is a continuation-in-part of application No. 08/514,049, filed on Aug. 11, 1995, now abandoned.

(51) Int. Cl.⁷ .......................................... H01L 31/0203
(52) U.S. Cl. ...................... 257/788; 257/793; 257/778; 257/779; 438/115; 438/124; 438/126; 438/127; 438/612; 428/413; 428/414; 428/416; 428/418
(58) Field of Search ............................... 428/413, 414, 428/416, 418; 257/787, 788, 793, 778, 779; 438/115, 124, 126, 127, 612

(56) References Cited

U.S. PATENT DOCUMENTS

| | | | |
|---|---|---|---|
| 3,449,641 A | 6/1969 | Lee | 317/234 |
| 3,791,027 A | 2/1974 | Angelo et al. | 260/495 |
| 3,939,488 A | 2/1976 | Wakashima et al. | 357/72 |
| 4,091,048 A | 5/1978 | Labana et al. | 260/836 |
| 4,282,136 A | 8/1981 | Hunt et al. | 260/38 |
| 4,356,505 A | 10/1982 | Lovinger et al. | 357/72 |
| 4,604,644 A | 8/1986 | Beckham et al. | 357/80 |
| 4,642,321 A | 2/1987 | Schoenberg et al. | 523/400 |
| 4,855,001 A | 8/1989 | Damico et al. | 156/307.3 |
| 4,980,086 A | 12/1990 | Hiraiwa et al. | 252/571 |
| 4,999,699 A | 3/1991 | Christie et al. | 357/65 |
| 5,107,327 A | 4/1992 | Nishimori et al. | 357/72 |
| 5,117,279 A | 5/1992 | Karpman | 357/72 |
| 5,128,746 A | 7/1992 | Pennisi et al. | 357/72 |
| 5,136,365 A | 8/1992 | Pennisi et al. | 357/72 |
| 5,250,848 A | 10/1993 | Christie et al. | 257/778 |
| 5,376,403 A | 12/1994 | Capote et al. | 427/96 |
| 5,418,266 A | 5/1995 | Shiobara et al. | |
| 5,439,164 A | 8/1995 | Hasegawa et al. | 228/184 |

Primary Examiner—David J. Buttner
Assistant Examiner—Christopher Keehan
(74) Attorney, Agent, or Firm—Ladas & Parry LLP; W. Dennis Drehkoff (57) ABSTRACT

Encapsulated electrical component assemblies and methods of electrically connecting an electrical component having a plurality of component electrical terminations to a component carrying substrate having a plurality of substrate electrical terminations at surface mount reflow soldering conditions is described. The electrical and substrate components have an encapsulant-forming composition sandwiched therebetween and encasing said pluralities of component and substrate electrical connections. The described invention relates to using an encapsulant-forming composition comprising a thermosetting resin (preferably an epoxy resin) and a cross-linking agent (preferably an anhdride) for said resin that cross-links said resin and that also acts as a fluxing agent and optionally includes a catalyst for initiating cross-linking at required conditions. The gel point of the encapsulant-forming composition is reached after solder melt.

13 Claims, 6 Drawing Sheets

ENCAPSULANT WITH FLUXING PROPERTIES AND METHOD OF USE IN FLIP-CHIP SURFACE MOUNT REFLOW SOLDERING

This application is a divisional of U.S. application Ser. No. 08/644,912, filed May 28, 1996 which is a continuation-in-part of application Ser. No. 08/514,049, filed Aug. 11, 1995 now abandoned, the disclosure of which is incorporated herein by reference thereto.

TECHNICAL FIELD

The invention relates generally to electrical interconnection of electrical components to substrates, in particular flip-chip reflow soldering and specifically the development of encapsulant-forming compositions.

BACKGROUND OF THE INVENTION

Epoxy resin compositions have been used as semiconductor device encapsulants for over 25 years as noted by reference to U.S. Pat. No. 3,449,641, granted Jun. 10, 1969.

Anhydride-cured epoxy resin encapsulants used in flip-chip manufacturing methods are described in U.S. Pat. No. 4,999,699, granted Mar. 12, 1991, and U.S. Pat. No. 5,250,848, granted Oct. 5, 1993. Encapsulant-forming compositions are applied after electrical interconnection.

The application of an encapsulant-forming (encapsulating), composition prior to interconnection by reflow soldering, wherein electrical interconnection occurs in the presence of an encapsulating composition is described in U.S. Pat. No. 5,128,746, granted Jul. 7, 1992. In U.S. Pat. No. 5,128,746, flip-chip production methods are described where electrical interconnection is achieved by adding a fluxing agent to a mixture of epoxy resin and curing agent prior to cure. During reflow soldering, the fluxing agent is activated and the resin is cured.

The use in the prior art of cross-linking agents having flux properties is found in PCT International Publication Number WO 93/06943, published Apr. 15, 1993 and its U.S. counterpart, U.S. Pat. No. 5,376,403, granted Dec. 27, 1994. In the publication, enhanced sintering is described using a protected cross-linking agent with fluxing properties in a metal powder and epoxy resin system where the solder is used to form the conductive film. Solder powder addition is used to sinter the metal powder, typically copper or silver, before setting the resin in order to create solid electrically conductive bridges between the powdered metal particles.

The use of synthetic thermosetting polymer resins together with soldering flux agents is described in U.S. Pat. No. 3,791,027, granted Feb. 12, 1974. Therein epoxide resin compositions are described wherein fluxing agents react with the epoxide resin to strengthen solder joints.

Electrically conductive adhesive compositions in which solder powder, a chemically protected cross-linking agent with fluxing properties and a reactive monomer or polymer (inclusive of epoxy resins) are described in U.S. Pat. No. 5,376,403, granted Dec. 27, 1994.

In the present invention, the fluxing additive of U.S. Pat. No. 5,128,746 is eliminated, while the function of fluxing is retained by selecting a cross-linking agent that has the property of also operating as a fluxing agent. In the flip-chip production method of the present invention, where electrical interconnection occurs within the encapsulating composition, the preferred embodiment of the invention resides in selecting a combination of dual functioning cross-linking agent and thermosetting resin or combination of such agent and thermosetting resin with a selected catalyst and controlling the sequence of flow soldering and gel formation to avoid inhibition of soldering. This is accomplished by providing an encapsulant composition, which, at surface mount reflow profile conditions, in which the gel formation (gel point is reached) after solder melt; that is, the gel is formed/gelation occurs after reflow soldering, whereby soldering is not inhibited.

As noted by reference to "MANUFACTURING TECHNIQUES FOR SURFACE MOUNTED ASSEMBLIES," Wassink, R. K. and Verguld, M. F., 1995 *ELECTROCHEMICAL PUBLICATIONS, LTD.*, soldering methods (and equipment) have converged from various IR soldering concepts to one main method, namely, hot-convection soldering. Besides this method other methods are used, but only in specific cases, such as resistance soldering for outer lead bonding of TAB and for soldering on foils.

In Wassink et al., at pages 275, 276, a typical profile for reflow soldering is described. A hot-air convection soldering oven having a number of zones whose temperature can be controlled separately is used in order to attain the desired temperature profile along the length of the entire oven. Such profile enables all joint areas to reach the soldering temperatures with limited temperature differences between the joint areas of components with different thermal mass.

Wassink et al. describes the typical three step heating approach of the prior art frequently used in reflow soldering using multiple hot-air convection ovens.

As also described in Wassink et al., the three steps are:
(i) starting with rapid heating to bring heat into the product (this reduces the length of the oven);
(ii) second step concerns temperature equalizing, i.e., to reduce the temperature differentials; usually a kind of temperature plateau for the hottest parts is pursued while the temperature rise of the coldest parts is chosen to be relatively slow; the effectiveness of this step can easily be assessed by the temperature differentials that exist on the assembly just before it enters the next step;
(iii) final rapid heating and subsequent cooling.

As further described in Wassink et al., each limit of the profile is determined by the maximum allowable thermal load of one of the parts of the assembly to be soldered.

The maximum (peak) temperature is determined by the base material of the printed board. Higher temperatures than 280° C. will cause delamination. (Note: In most cases the printed board is the hottest component.)

The minimum soldering (peak) temperature is determined by the wetting of component metallizations.

The maximum time and temperature of the equalize region is determined by the solder paste. In the case of too heavy a thermal treatment, the activator (flux) in the solder paste will be consumed already at this stage of the process.

The time for which the solder is in the molten stage (in combination with a maximum temperature) is restricted by the formation of intermetallic layers inside the soldering joint. These layers make the soldered joint more brittle.

The specific values of the mentioned boundaries are determined based on the components and board material used.

Figure 4:
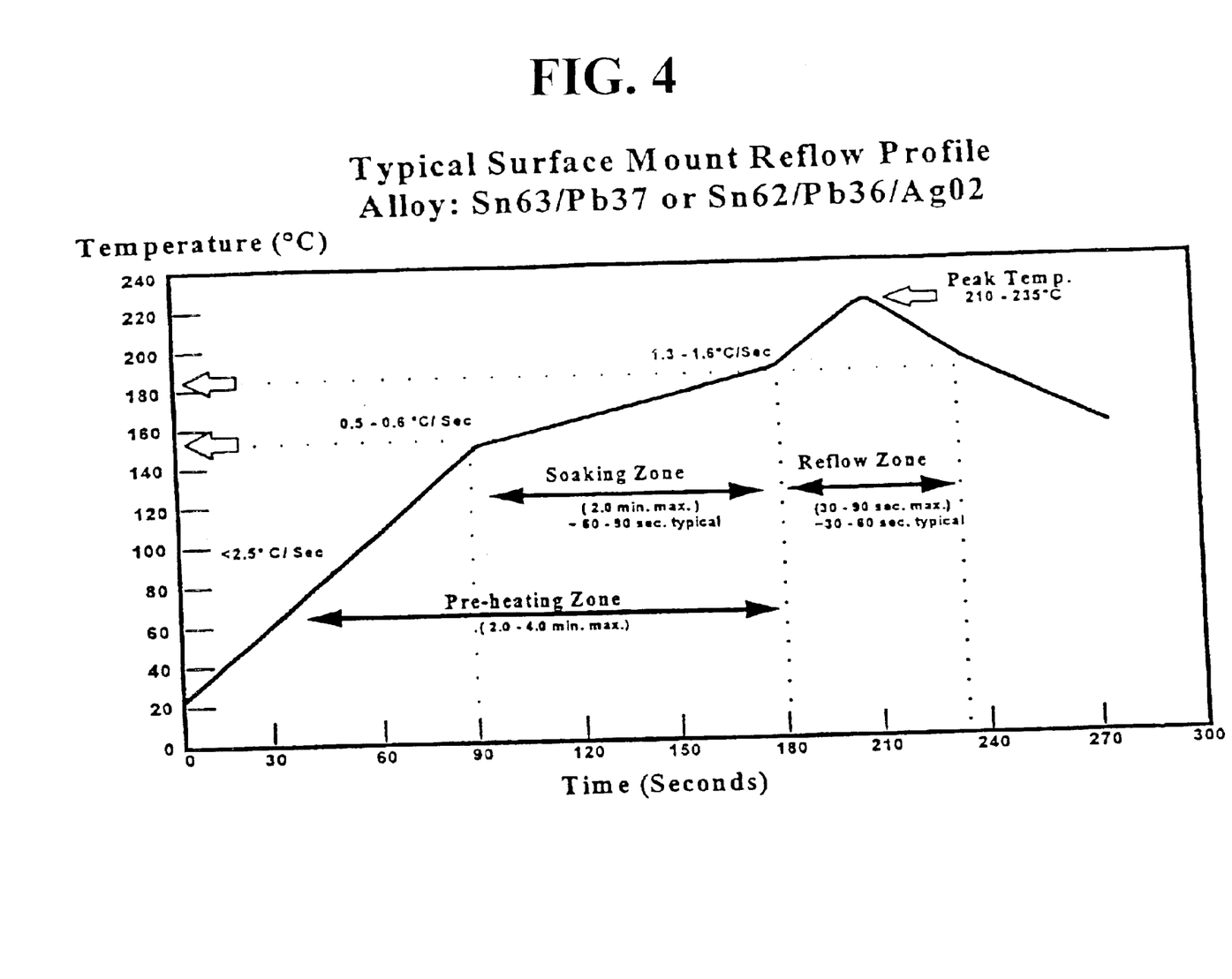
FIG. 4 is a surface mount reflow profile for 63 Sn/37 Pb also applicable to Sn 62/Pb 36/Ag 02 solder illustrating typical parameters where such solders are used.

A surface mount reflow profile for a 63 Sn/37 Pb solder illustrating the typical ranges is shown in FIG. 4.

In U.S. Pat. No. 3,791,027 ("Angelo"), the disclosure of which is incorporated herein by reference thereto, polymers and other materials which contain chemical functionalities; such as, amide, amino, carboxyl, imino, and mercaptan; which serve as flux agents are described. When soldering metals, these materials can be combined with materials which contain other functionalities; such as, epoxide and isocyanate to produce thermosetting polymers. Angelo describes three polymer categories in his invention which are set forth below.

1. Chemical functionalities; such as, carboxy terminated polybutadiene and carboxy terminated polyisobutylene, which, when used alone, do not harden and are easily removed with solvents. These are in essence fluxes and contain the same chemical functionalities found in traditional soldering fluxes.
2. Formulations that are non-crosslinking and can be softened or melted with the addition of heat. Examples cited in Angelo include Versarid 712 and Acryloidat 70. Since cross-linking does not take place, these formulations are similar to standard rosin or resin based fluxes frequently used in reflow soldering which contain chemical functionalities such as amino, carboxyl, amide, etc. Thus the same chemical functionalities are present both traditional rosin and resin fluxes and in the examples cited in Angelo which do not chemically cross-link to form thermoset polymer and hence may be removed by using a solvent or may be reheated and remelted to enable resoldering of solder joints.
3. Combinations of materials, which contain the chemical functionalities necessary to promote solder wetting; such as, carboxy, amino, etc., and materials that react chemically to form thermosetting polymers that cannot be easily removed through use of a solvent or reheated and remelted. Specifically Angelo shows examples of combinations of materials which contain such functionalities with epoxy resin materials which, when heated, form cross-linked networks which are not easily removable or cannot be remelted. Angelo cites the usefulness of such combinations to reside in their ability to reinforce the strength of the solder joint in situations when there is a low probability that a solder joint will need to be resoldered.

Pennisi, et al., U.S. Pat. No. 5,128,746, also describes the use of combinations of materials which contain chemical functionalities known to serve as fluxes and materials; such as, epoxy resins, which when reacted with the addition of heat, form chemically cross-linked polymers which add strength to solder joints and are not easily removable. Although Pennisi describes the function of the epoxy thermoset polymers as providing environmental protection to the flip-chip, the epoxy encapsulant described by Pennisi is also known to strengthen the fragile solder joints. Pennisi lists flux agents; such as, malic acid and other dicarboxylic acids that remove metal oxides and promote solder wetting. In essence, a material, malic acid, containing the carboxyl functional group, which is known to promote solder wetting, is combined with materials, epoxy resins, that form cross-linking, thermoset polymers.

In a third example, described in Capote, U.S. Pat. No. 5,376,403, a material containing a chemical functionality, such as carboxyl, known to assist in solder wetting, is combined with materials that form cross-linking thermoset polymers that are used in ink systems that assist in the fusing of low melting alloy powders with high melting metals and assist in the adhesion of the resultant metal network to a substrate.

In each case (Angelo, Pennisi, Capote) in which a material containing a chemical functionality, known to promote solder wetting, is combined with materials such as epoxy resins that form thermoset polymers, a method of heating is described in which the assembly is heated rapidly above the solder melt point. The application of temperatures above the solder melt point 183° C. is critical as the solder must liquify in order to wet the surface metal.

As thermosetting polymers are initiated by the application of heat in order to stimulate cross-linking reactions, it becomes necessary to understand the cure kinetics involved in the curing of the material combinations selected. By chemically protecting the cross-linking material of the combination, Capote ensures that the cross-linking reactions are delayed and appropriate during the rapid heating process described in his invention.

Similar heating methods are described in Angelo and Pennisi, who both describe the application of heat during the soldering process as quick and rapid. As described previously in Wassink et al., a three step heating profile is typically used to solder electronic components to substrate boards. Rapid heating, as called for in Angelo, Pennisi and Capote, would adversely affect the parts and assemblies during soldering. This includes damage to components at high thermal excursion rates.

Thus, one frequently finds the heating step to be done using multizone ovens which allow materials in assemblies to achieve thermal equilibrium at temperatures above room temperature but lower than the solder melt point (183° C.) in order to reduce thermal shock and subsequent damage. In SMT, this heating process in known as a surface mount reflow profile.

Therefore, in using combinations, as set forth by Angelo, Pennisi and Capote, in which materials containing chemical functionalities; such as carboxyl and amino, known to promote solder wetting, are combined with materials that form cross-linked thermoset polymers through the addition of the heat, heating processes are used that do not involve a rapid heating rate to the solder temperature but instead allow materials to be used in the final assembly to reach a thermal equilibrium. Above room temperature but lower than soldering temperature, it becomes critical to understand the cure kinetics of the combination of thermosetting materials, in view of the desired non-rapid heating profile in order to prevent significant crosslinking of the combination prior to solder melt point.

The Present Invention

The present invention relates to thermosetting resin encapsulating formulations in which the cross-linking agent functions as flux for reflow soldering. Included in such formulation are systems in which the cross-linking of resin with such dual purpose cross-linking agent is effected by a catalyst. In the present invention, the cross-linking agent acts as a fluxing agent at reflow soldering conditions and acts as a cross-linking agent in the involved resin system in a manner such that soldering is not inhibited by premature gelling.

In systems of the present invention, where electrical connections along a single axis are involved and reflow soldering is effected in a liquid resin system, the sequencing of stages of cross-linking vis-a-vis reflow soldering is critical.

It is essential that the gel point of the system not be reached prior to formation of the interconnection by liquid solder which interconnection occurs at reflow solder temperature.

It has been observed that where the gel point is reached before melting of the solder, the solder does not wet and does not effectively engage the opposing locus where the electrical interconnection is to be made because solder flow is restricted.

It is believed that the criticality of this requirement in the system of the present invention derives from the inability of the solder to flow in a resin system where the gel point has been reached. It is believed that where the resin system enveloping the solder is liquid, even where the viscosity is great, the melted solder traverses and bonds to the opposing target area and is fluxed by the cross-linking agent. In fact, where a mixed phase exists, wetting, bonding and fluxing occur; however, once the gel point is reached and melt occurs, observation of the cured product demonstrates the failure of successful interconnection and the failure of wetting and flow.

One aspect of the present invention relates to an epoxy resin based encapsulant-forming composition for use in reflow soldering of an electrical component to a substrate. The composition forms an acid anhydride epoxy resin system. The fluxing encapsulant composition is composed of an epoxy resin, an anhydride cross-linking agent for the resin that also functions as a fluxing agent at reflow soldering conditions and a catalyst. The combination of compounds comprising the encapsulant composition is selected to provide a composition which does not reach gel point prior to formation of electrical interconnection at said reflow soldering conditions.

The thermosetting resin is preferably an epoxy resin and the cross-linking agent is selected from anhydrides that intrinsically possess the added activity of fluxing at reflow soldering temperatures.

Referring specifically to eutectic tin/lead soldering temperatures (183° C.), examples of anhydrides that serve as fluxes include succinic anhydride, methyltetrahydrophthalic anhydride, polyadipic polyanhydrides, tetrahydrophthalic anhydride, hexahydrophthalic anhydride, polyazelaic polyanhydrides, and admixtures thereof. The fluxing agent of choice is methyltetrahydrophthalic anhydride and the catalyst-containing encapsulant composition of choice is tin octoate.

Another aspect of the invention relates to a method of attachment and encapsulation of integrated circuits, such as flip-chips or ball-grid arrays, wherein reflow soldering is effected by the encapsulant-forming composition. It is essential that the catalyst promotes gel formation during or after soldering, but does not form a resin gel (a gel at or past gel point) before soldering in order not to inhibit soldering by formation of the gel prior to soldering.

Yet another aspect of the present invention relates to an electrical component having a plurality of electrical terminations, each termination is composed of a solder bump; a component carrying substrate having a plurality of electrical terminations corresponding to the terminations of the electrical component; and, an encapsulating material that removes metal oxides from the surfaces of the electrical terminations of both the component and substrate. Such encapsulating material is preferably composed of an epoxy resin, an anhydride that functions as a fluxing agent to remove the oxide coatings from the component terminations and the substrate terminations prior to and during soldering and also reacts with the epoxy. The gel point of the encapsulant-forming composition is reached at or above the soldering temperature. In the assembly, the encapsulating material is disposed between and fills the opening between electrical component and substrate. This may be done either by dispensing encapsulant on the board and then pressing the component onto the encapsulant or by dipping the component in the encapsulant prior to placement on the board. After heating to soldering temperature, the solder is reflowed and electrically connects the electrical component to the substrate. The catalyst present in the encapsulation composition promotes gel formation during or after soldering so that soldering is not inhibited by premature gelling. In other words, fluxing and reflow soldering occur prior to resin system gel point.

Properties of Encapsulant (The Cured Encapsulating Composition)

The physical properties of the cured epoxy encapsulant include such measurable properties as glass transition temperature, tensile strength, modulus, dielectric strength, and dissipation factor. These properties affect reliability of the final encapsulated component. The application of the product containing the encapsulated component determines the physical properties that the encapsulant must possess.

For example, flip-chip components typically require glass transition temperatures at or above 120° C. The choice of the resin and anhydride components will therefore be restricted to compositions which yield glass transition temperatures at or above 120° C. DGEBA resins, EEW 180–190 are among the resins of choice for this application.

Resin Selection

The choice of the resin in the system depends on the desired properties of the final product. The functionality of the resin and its chemical structure will influence the cross-link density of the cured system. Typically, DGEBA or novolak resins are preferred with anhydride cured systems. Epoxy resins based on methylene dianiline; such as, MY720 from Ciba Geigy or resins containing an amine will cause premature gelation before soldering, since the amine acts as a catalyst. Therefore, these latter epoxy resins are unacceptable for use in the present invention.

The present invention involves the use of compositions which function as flux and hardener for thermosetting resins and in particular epoxide resins, the resins of choice, in encapsulating formulations which find application in and are adopted for use at surface mount reflow soldering profile conditions adapted for assembly architecture and composition of the bond sites. The encapsulants of the present invention are formulated based on reflow temperature profile and the bond site composition which, after melt, forms the electrical interconnection.

Thus in accordance with the present invention the soldering profile in such instances includes heating the assembly components to a temperature below the soldering temperature to prevent damage to the assembly parts that are susceptible to injury at high thermal excursion rates. This heating step is dependent on the size, mass and materials used in the assemblies and is referred to in the art as the soak or equilibrium stage of the profile. In connection with computer mother boards, telecommunications equipment and panels of smaller assemblies, the target temperature at the end of the soak step preferably approaches the solder melt point and may range from about 20° C. below the solder melt point up to the melt point thereof. The period of application of heat to achieve the target equilibrium temperature typically varies and may be from about 30 to about 120 seconds for large surface mount assemblies. The soaking step is preceded by a rapid increase in temperature, called the ramp step; the rate of increase in temperatures is selected to achieve maximum heat input without injury such as microcracks, warping and the like and is dependent on the involved architecture and materials. In the case of typical large surface mount assembly temperature increases of about 1° C. to about 4° C. per second prior to soak are the norm. The final step involves a rapid heating step following soak where the assembly is quickly heated to a temperature above the solder powder melting point in order to form the metal interconnection between the assembly components. Typically one component of the assembly is an electrical component such as a packaged or unpackaged integrated circuit and the other component is a substrate for microelectronic circuitry on which the metal bond sites are located. In the art this step is referred to as the spike stage with a total time above melt point typically ranging from about 30 to 90 seconds. The peak temperature at any locus on the assembly is preferably in the 205° C. to 235° C. range.

For low thermal mass assemblies; that is, assemblies less than 0.062 inches thick and/or assemblies having an area typically 10 square inches or less, heat input is typically achieved using a smooth non-stepped ramp at the rate of 1°–4° C. per second. Solder melt typically is achieved for low thermal mass assemblies in a time frame varying from something less than a minute up to about three minutes.

As the thermal mass of the assembly increases, slower heating rates and stepped processes are employed to bring such assemblies up to thermal equilibrium prior to reflow.

A criteria for selection and combination of thermosetting resin and cross-linking agent (whether in the presence of catalyst or otherwise) in order to achieve the requisite sequence of achieving solder melt before the gel point is reached resides in selecting a thermosetting resin and cross-linking agent combination that when heated using differential scanning calorimetry ("DSC") displays initiation of exothermic reaction with the range of about 140° C. to 180° C. for lead tin eutectic mixture. Exothermic activity as observed using DSC correlates to cross-linking activity. The peak of said exotherm in turn correlates with the level of cross-linking that indicates gel formation.

Although in the final analysis gel formation for the specific combination is determined empirically and exceptions occur, the criteria for selection that is generally applicable is to choose polymer systems wherein exothermic activity, as observed using DSC, is preferably initiated at a temperature no lower than 40° C. below the solder melting point and where the peak exothermic activity registered occurs at a temperature above the solder melting point.

Anhydrides, including, in particular, highly active polyanhydrides, are the preferred dual-functioning cross-linking and flux agents for the encapsulant of the present invention.

In addition to the aforesaid anhydrides, other cross-linking agents that are suitable for use in the present invention, though not necessarily with the same order of success, include materials containing chemical functionalities, such as carboxyl, amino, imino, amide, and mercaptan, as described in Angelo, that inherently act as fluxing agents as well as cross-linking agents.

Amine cross-linking agents that provide the requisite latency (gel point formation at or above the melting point of the solder powder), such as Aificure—LX-1 (manufactured by Ajinomoto Co., Inc., Tokyo, Japan), which is heterocyclic diamine having an active hydrogen equivalent 67, may be used.

Amides and other known nitrogen containing curing agents such as melamine, dicyandiamide, imidazoles, hydrazides, thioureas and the like may also be used as cross-linking agents.

Also useful as crosslinking agents are the well-known polydric phenols which are polycondensates of one or more phenols such as phenol, various alkylphenols and naphthols with aldehydes such as formaldehyde, acetaldehyde, acrolein, glyoxal, benzaldehyde, naphthaldehyde and hydroxybenzaldehyde or ketones such as cyclohexanone and acetophenone, vinyl polymerization type polyhydric phenols such as polyvinylphenol and polyisopropenylphenols, the polyhydric phenols of the present first invention, Friedel-Crafts type reaction products of phenols with diols such as those represented by the formula (1):

Dialkoxy compounds represented by the following formula (2):

or, dihalogens represented by the following formula (3):

and Friedel-Crafts type reaction products of phenols with diolefins such as dicyclopentadiene and diisopropenylbenzene.

In assemblies where the inherent fluxing ability of the cross-linking agent is insufficient to form proper metallurgical solder connections, it may be necessary to add additional fluxing agents in order to increase the flux activity to the formulation.

To supplement the fluxing activity possessed by the encapsulant attributable to the combination of cross-linking agent and thermosetting resin, other known fluxes may be added in minor amounts so as not to adversely effect the properties of the cured thermoset polymer. Moreover, in choosing the fluxes, whether the basic cross-linking agents of the present invention with flux activity or the supplemental fluxing agents, low molecular weight compositions which generate outgassing at surface mount reflow soldering conditions utilized cannot be used since the integrity of the encapsulation is compromised when outgassing occurs by the presence of voids in the encapsulant. Accordingly, dicarboxylic acid flux agents which produce outgassing should be avoided.

Moreover, in selecting the supplementary fluxing agent, its effect on material properties, such as adhesion, tensile strength, moisture absorption or glass transition temperature must be considered. Accordingly, compounds appearing to be compounds of choice because of high flux activity, such as dicarboxylic acids, which reduce glass transition temperature and bulk physical properties of the final polymer network, need to be used, if at all, in amounts that do not affect the resultant polymer.

It has been found that the carboxy terminated polyesters used in the ink formulations of U.S. Pat. No. 5,439,164 are suitable as supplementary flux additives in the encapsulants of the present invention.

It has also been found, where the cross-linking agent, in the amounts used, has inadequate activity as flux to achieve the required level of oxide removal, that among the preferred additives are those that cross-link or bind chemically into the polymer matrix and do not retard the physical properties of the resultant polymer network. For this purpose carboxy terminated polyesters have been found to be a suitable flux additive.

SUMMARY OF THE INVENTION

The present invention relates to an encapsulant suitable for use at surface mount reflow profile conditions and a method of electrically connecting an electrical component having a plurality of metal bond site terminations to a component carrying substrate having a plurality of metal attachments sites corresponding to the terminations of said electrical component, at surface mount reflow profile conditions. These conditions vary based on the solder used on the solder bumps, typically forming the metal bond site on the electrical component and the composition and architecture of electrical component and substrate involved. The protocol followed is equivalent to that described in FIG. 4 herein. The encapsulant utilized is comprised of a thermosetting resin and a cross-linking agent that acts, below the solder melt temperature, as a fluxing agent which removes oxide coatings from the surface of the metal bond sites on said electrical component and on said component carrying substrate when heated to said solder melt temperature. The thermosetting resin and cross-linking agent combination has a gel point at or above the solder melt temperature, and preferably above the solder melt temperature. The method comprises the steps of: a) removing oxide coating from the surface of metal bond sites while the encapsulant is in liquid form; b) melting the solder at the metal bond sites to electrically connect the electrical component which has the plurality of metal bond site terminations to the component carrying substrate which has the plurality of metal bond site terminations corresponding to the terminations of said electrical component while said encapsulant is in liquid form and prior to said encapsulant reaching its gel point; then c) forming an encapsulant gel; that is, reaching the gel point. Thereafter the gel may be cured to form the encapsulant, thereby providing protection and enhancing the mechanical connection.

The thermosetting resin is preferably an epoxide. The preferred cross-linking agents are a polyanhydride and carboxy terminated polyesters.

The present invention also relates to a method of producing a low thermal mass assembly by, simultaneously, during surface mount reflow soldering, encapsulating and electrically connecting an electrical component having a plurality of metal bond site terminations to a component carrying substrate having a plurality of metal attachments sites corresponding to the terminations of said electrical component utilizing an encapsulant comprised of a thermosetting resin and a cross-linking agent that acts, below the solder melt temperature, as a fluxing agent which removes oxide coatings from the surface of the metal bond sites on said electrical component and on said component carrying substrate. The thermosetting resin and cross-linking agent combination has a gel point at or above, and preferably above, the solder melt temperature. In this method the low thermal mass assembly is ramped at the rate of about 1° C. to about 4° C. per second for a time sufficient to achieve solder melt and electrical interconnection. The steps of the method occur sequentially during ramping, as follows:

1. oxide coating is removed from the surface of the metal bond sites, while the encapsulant is in liquid form;

2. The solder, which may comprise one or the other bond sites is melted to electrically connect the electrical component having a plurality of metal bond site terminations to the component carrying substrate having a plurality of metal attachment sites corresponding to the terminations of said electrical component (the encapsulant is in liquid form during this step and solder melt occurs prior to the encapsulant reaching its gel point); then 3. The encapsulant gel is formed at the gel point. Thereafter, the resultant gel is cured to encapsulate said electrical solder connections. The preferred thermosetting resin is an epoxide. The preferred cross-linking agents are polyanhydride and carboxy terminated polyesters.

Yet another aspect of the present invention relates to a specific encapsulant for encapsulating and electrically connecting a metal bond site of a first electrical component to a metal bond site of a second electrical component at surface mount reflow conditions. The encapsulant comprises an epoxy resin; a cross-linking agent for the resin that also acts as a fluxing agent that removes oxide coatings from the surface of the first and second electrical components; and a catalyst for catalyzing cross-linking of said epoxy resin with said cross-linking agent, the peak exotherm of said mixture of catalyst, epoxy resin, and cross-linking agent as measured using DSC at a ramp rate of 10° C. per minute being at or above the solder melting point whereby the gel point of said cross-linked epoxy resin is reached after solder melt. The preferred catalyst is tin octoate. The preferred cross-linking agents are polyanhydrides.

Another aspect of the present invention relates to a method for selecting the components of the encapsulant wherein the encapsulant is comprised of a thermosetting resin, a cross-linking agent that also acts as a flux and optionally a cross-linking catalyst which comprises: a) identifying the melting point of the involved solder at the metal bond sites; b) heating the encapsulant composition to a temperature exceeding the melting point of such solder; c) measuring the exothermic activity of the encapsulant during heating step b); d) identifying the temperature at which peak endothermic activity occurs; and e) selecting as an encapsulant an encapsulant that displays peak exothermic activity at or above the melting point of the solder.

The selection method suitably also includes identification of the initiation of exothermic activity and selection of the encapsulant also based on initiation of thermal reaction. The encapsulant selected is one that wherein initiation of exothermic activity occurs at a temperature that is no lower than 40° C. and preferably no lower than 30° C. below the solder melt temperature.

DETAILED DESCRIPTION OF THE INVENTION

The catalytically activated encapsulant of the present invention comprises (1) thermosetting resin, preferably an epoxy resin, (2) a cross-linking agent for such resin, which also functions as a fluxing agent during reflow soldering, and (3) a catalyst. The components of the encapsulant are selected and combined to form, in combination, a composition having a gel point temperature at or above the soldering temperature whereby surface soldering is not inhibited by gelling prior to soldering when using a surface mount temperature profile. As used herein, gel point temperature is the temperature for the involved thermosetting resin system where, after initiation of catalyzed cross-linking, the gel point is reached. Simply stated, the process of the present invention will not produce a satisfactory electrical connection if, prior to solder melt, which occurs at the solder melt temperature, the gel point of the involved epoxy resin system is reached. The cross-linking agent acts as flux during the soldering step. The cross-linking agent cures the epoxy resin and performs this latter function paired with a catalyst that catalyzes cross-linking activity and causes gel formation at or above the soldering temperature at which electrical connection with solder melt occurs. Other objects and advantages will become apparent to those skilled in the art from a review of the detailed description of the invention which follows.

In systems of the present invention, the sequencing of stages of cross-linking vis-a-vis reflow soldering is critical.

It is essential that the gel point of the system not be reached prior to formation of the connection by liquid solder (solder melt) which connection occurs at surface mount reflow solder temperature.

It has been observed that where the gel point is reached before melting of the solder, the solder does not wet and does not effectively engage the opposing loci to be electrically connected because solder flow is restricted.

It is believed that the criticality of this requirement in the system of the present invention derives from the inability of the solder to flow in a resin system where the gel point has been reached. It is believed that where the resin system enveloping the solder melt is liquid, even where the viscosity is great, effective fluxing occurs. In fact, where a mixed phase exists, wetting, bonding and fluxing occur; however, once the gel point is reached and melt formation occurs after the gel point is reached, observation of the encapsulated assembly demonstrates that successful connection is not achieved. There is a failure of proper melt formation, wetting and flow.

Figure 1:
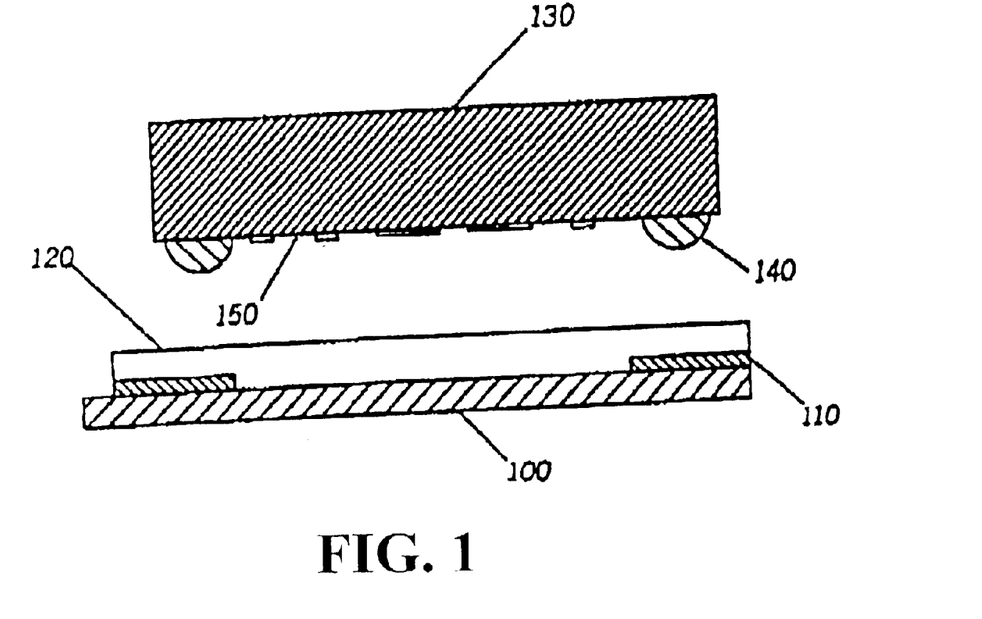
FIG. 1 is a sectional elevational view of a device prior to attachment to a substrate.

Referring to FIG. 1, a substrate 100 with metallization pattern 110 is selectively coated with an encapsulating material 120. The material is an encapsulant-forming composition comprised of a thermosetting resin, a cross-linking agent for said resin, which also acts as a fluxing agent for reflow soldering and a catalyst selected to provide, in combination with resin and flux, a composition in which gelation of the resin does not interfere with soldering.

An example of a suitable encapsulating material comprises (1) an epoxy resin, diglycidal ether of bisphenol A with an epoxy equivalent weight of 188, (2) methyltetrahydrophthalic anhydride cross-linking and fluxing agent and (3) tin octoate catalyst. The cross-linking agent is an anhydride cross-linking agent which also acts as fluxing agent. The MTHPA cross-linking agent is paired with tin octoate catalyst that catalyzes cross-linking at a temperature at or above about the soldering temperature, thereby preventing premature gel formation prior to formation of the electrical interconnections by flow soldering.

The amount of anhydride relative to epoxy, preferably ranges from about 75 parts to about 85 parts of anhydride per hundred parts of epoxy resin (75–85 phr).

The amount of catalyst in the composition preferably ranges from about 0.1 to about 5 weight percent. In the case of tin octoate, the preferred amount is from about 1.5 to about 2.5 weight percent and the optimal amount is about 2.0 weight percent based on the weight of encapsulant-forming composition inclusive of catalyst.

Figure 2:
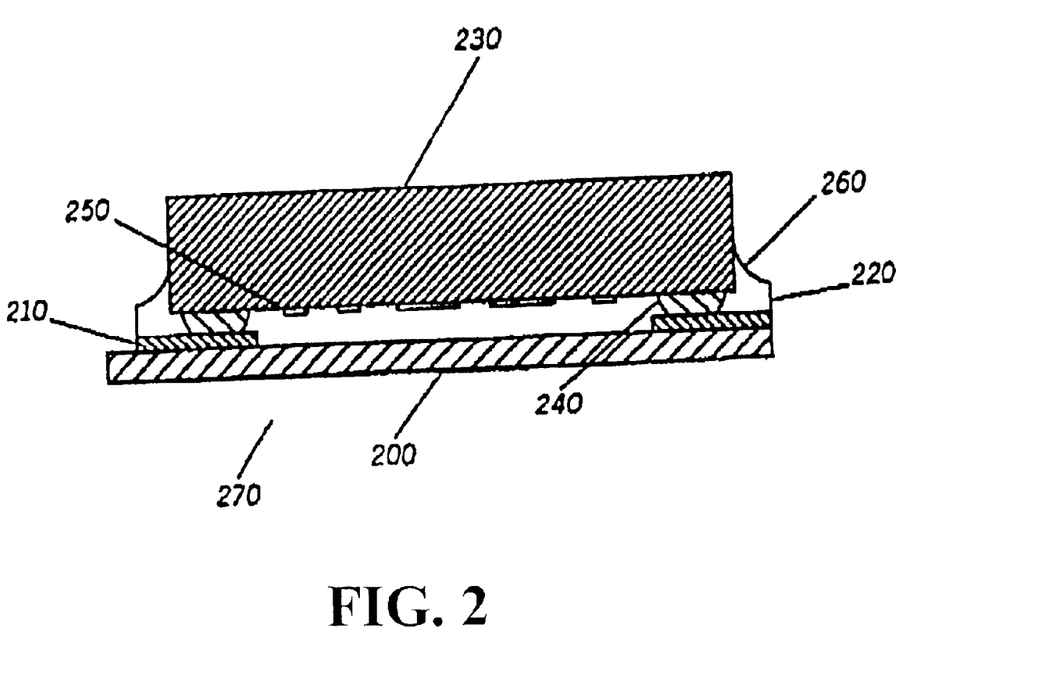
FIG. 2 is a sectional elevational view of a device after being reflowed to a substrate.

A device 130 containing solder bumps 140 is positioned so that the solder bumps 140 and the active surface 150 are facing the substrate 100 and aligned with the metallization pattern 110 of the substrate 100. Referring to FIG. 2, the bumped device 230 is moved into intimate contact with the metallization pattern 210. The encapsulant-forming composition 220 wets the device 230, insuring complete coverage of the active surfaces 250 of the device 230. The meniscus 260 provides a continuous seal around the periphery of the device 230 to protect the active surface 250 from environmental contamination. The cross-linking agent contained in the encapsulant-forming composition 220 coats the solder bumps 240 and the metallization pattern 210.

It should be appreciated that although the drawings depict the device 130 as an integrated circuit encapsulated and connected to a substrate, embodiments using other types of surface mounted components having solder bumps or not are within the scope of the invention.

The assembly 270 is reflowed in a conventional manner; the cross-linking agent, functioning as flux, reduces the oxides on the solder 240 and the metallization surface 210, and permits alloying of the solder to the metal.

Figure 3:
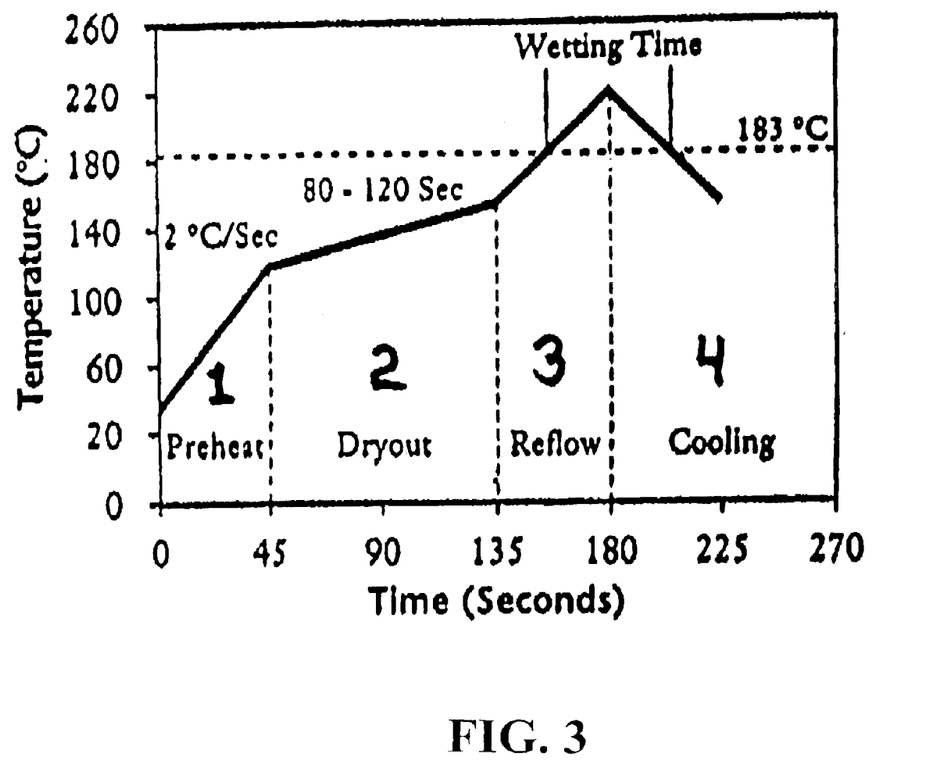
FIG. 3 is a reflow soldering profile of the soldering method of the present invention.

FIG. 3 represents a typical surface mount profile. The present invention can accomplish both soldering and encapsulation following such typical profile followed by post-cure at substantially lower temperatures than soldering, in accordance with the profile, typically 150° C. for about 1 to 2 hours. Illustrating the requirements of the present invention, by reference to the surface mount profile depicted in FIG. 3, gel formation prior to reflow, Zone 3, would impede soldering. Premature gelation before reflow forms a physical barrier preventing the solder from wetting the target metal surface.

In FIG. 3, Zone 1 depicts the step of preheating in terms of the parameters of the temperature (ordinant) and time period (abscissa) that the entire assembly comprising substrate, components and encapsulant is preheated to a temperature typically 25° C. to 50° C. below the solder melting temperature. Zone 2 depicts the soak step illustrating the period of soak where the temperature of the assembly is allowed to equilibrate. Zone 3 depicts the reflow step when reflow occurs. Zone 4 depicts the cooldown step. The surface mount profile illustrated in FIG. 3 is merely illustrative of a typical profile which is applicable, inter alia, to the embodiment of the invention exemplified in Example 1. Time and temperature on which soldering is dependent, is dependent on the encapsulant and other parameters of the process.

Selection of Encapsulant System Components for Given Reflow Profiles

As noted herein, the present invention relates to solder paste formulations and methods of their use specifically adopted for forming protectively encased isotropic electrical interconnections at reflow profile conditions used in the manufacture of small and large mass assemblies. Such reflow profile conditions require application of heat over time and encapsulant formulation is critical to achieving satisfactory wetting and solder melt to provide electrical interconnection at the bond sites as well as satisfactory encasement/mechanical bonding.

In choosing the encapsulant used in the present invention, selection of thermosetting resin and cross-linking agents having the dual functions required in the present invention is critical in order to enable satisfactory electrical and mechanical bonding at the electrical bond sites to take place. The encapsulant requirements and selections are discussed below.

During the reflow profile, the polymer must not reach its gel point before solder melt, since the molten solder must displace the polymer in order to wet the bonding surface. If the polymer reaches its gel point too quickly, a polymer barrier is formed between the metal surfaces. Since this gelation inhibits the solder from wetting the substrate metal bond pad, it is critical to understand the curing mechanism and kinetics of the polymer in order to understand the effect on soldering.

In thermoset polymers, the addition of heat initiates the irreversible reaction between the epoxy resin and the cross-linking agent. During the cure process the epoxy resin molecules react with the cross-linking molecules to form long polymer chains and networks with increasing viscosity. As the network grows, a point of infinite viscosity is reached called the gel point. At this point the polymer changes from a viscous liquid to a solid that does not flow.

The gel time of thermosetting resins is usually found under isothermal conditions. For example, epoxy samples can be heated at a set temperature and tested using viscosimetric methods to find the gel time. An example of such a method is to heat epoxy resins in sample pans while measuring resistance to flow.

Since the method of heat during the process described in this invention is not isothermal but rather involves a slow heating of the sample to soldering temperatures, it is important to instead estimate the gelation of the polymer by examining the cure kinetics.

Several techniques can be used to examine cure kinetics of the thermoset polymers. One such method is dynamic mechanical analysis (DMA), which measures the polymer's ability to store and dissipate mechanical energy. Another common technique is to use differential scanning calorimetry (DSC), which measures changes in heat.

As the chemical reaction of thermoset resins during polymerization is exothermic, this change in heat can be measured using DSC and related to the extent of chemical reaction. As described by Hadad in *Epoxy Resins, Chemistry and Technology*, May, ed., Marcel Dekker, 1988, p. 1130, "an assumption is made that the amount of energy given off during the cure is proportional to the extent of chemical reaction." Using techniques described by Hadad it is possible to estimate the kinetic activation energy required for initiation of polymerization. One such method involves generating DSC scans using different heating rates as described in ASTM Method E 698-79. However, since the critical gelation point in order to prevent proper soldering interference as described in this invention must be determined empirically, DSC will be shown to serve only as a guide for proper material combinations as the soldering process has previously been described as ranges. Therefore, a single DSC scan at a single heating rate is used to show the relationship between cure kinetics of thermosetting polymers and their applicability for use in the method of soldering described in this invention.

The following examples serve to illustrate a mode of practicing the invention.

EXAMPLE 1

An encapsulating material of the present invention with fluxing properties was prepared by combining the following components:

| Component | % by Weight |
|---|---|
| Shell 828 (DGEBA – EEW = 188) | 54.5 |
| A&C AC220J (MTHPA) | 43.5 |
| Catachek 860 (tin octoate) | 2 |

The material was spread on the copper surface of a standard copper clad FR-4 board. A small ring of 63 Sn/37 Pb eutectic solder was placed on the epoxy. The board was placed in an IR reflow oven. The profile was the standard solder paste reflow used for solder paste. The ring soldered to the copper leaving an epoxy residue which was past its gel point.

EXAMPLE 2

The encapsulating material prepared is dispensed on the surface of the metal, copper, which has been plated to an organic substrate, such as FR-4. A solid piece of solder, 63 Sn/37 Pb eutectic, is placed on the surface of the epoxy. The test board, now containing both the encapsulating material and the solder on the surface of the metal, are placed in a reflow oven, either IR or convection and subjected to the standard reflow profile shown in FIG. 3. The epoxy material serves first as a flux and assists in the bonding of the solder to the copper. After the reflow, the epoxy is gelled, that is, proper interconnection is observed.

EXAMPLE 3

The encapsulating material prepared in Example 1 is dispensed on the metal bond sites on substrates to which a solder bumped component, such as a flip-chip, would attach. The flip-chip die is placed on the encapsulating material so that the encapsulating material completely interfaces the lap between the die and the substrate, the substrate can be organic, such as FR-4, or inorganic, such as, glass or ceramic. The metal bond sites are copper or gold, with or without a plating of solder. The solder bumps on the die are 63 Sn/37 Pb eutectic, on which the solder from the die bumps reflows and bonds to the bond sites on the substrate. Suitably a high melting alloy, such as 63 Sn/37 Pb, can be used, in which case the eutectic solder plating on the metal bond site would reflow and bond to the bumps. On the die, the flip-chip die, encapsulating material and substrate are aligned and placed in a reflow oven, either IR or convection, and subjected to the standard reflow profile shown in FIG. 3. During the reflow process, the MTHPA component of the encapsulating material serves as a flux and enables the soldering of the component to the board. The pairing of MTHPA and tin octoate also provides an appropriate level of cross-linking during the reflow process, which yields a resin gel suitable for post cure and wherein the gel point is reached at a point in the overall process where soldering is not inhibited.

The following examples serve to illustrate a mode of practicing the invention including selection of encapsulant components.

EXAMPLE 4

A mixture of a bisphenol A epoxy resin (Shell Epon 828), methyl tetrahydrophthalic anhydride (MTHPA) (Lonza AC220J) and the catalyst Tris(dimethylaminomethyl)-phenol, commonly referred to as DMP-30 (Lonza AC-30) was prepared according to formulations as described in literature available from the chemical suppliers:

| | |
|---|---|
| Epon 828 | 55 parts |
| MTHPA | 43 parts |
| DMP-30 | 2 parts |

The resultant composition was spread onto a copper heated to 250° C. along with a slug of 63Sn/37Pb solder in accordance with the method set forth by Angelo (U.S. Pat. No. 3,791,027) and in heated rapidly as described in Pennisi U.S. Pat. No. 5,128,746 and Capote U.S. Pat. No. 5,376,403. It was observed that the anhydride (MTHPA) cleaned the surface oxides from the metal surfaces which allowed the solder to wet onto the copper and form a metallurgical interconnect.

Figure 5:
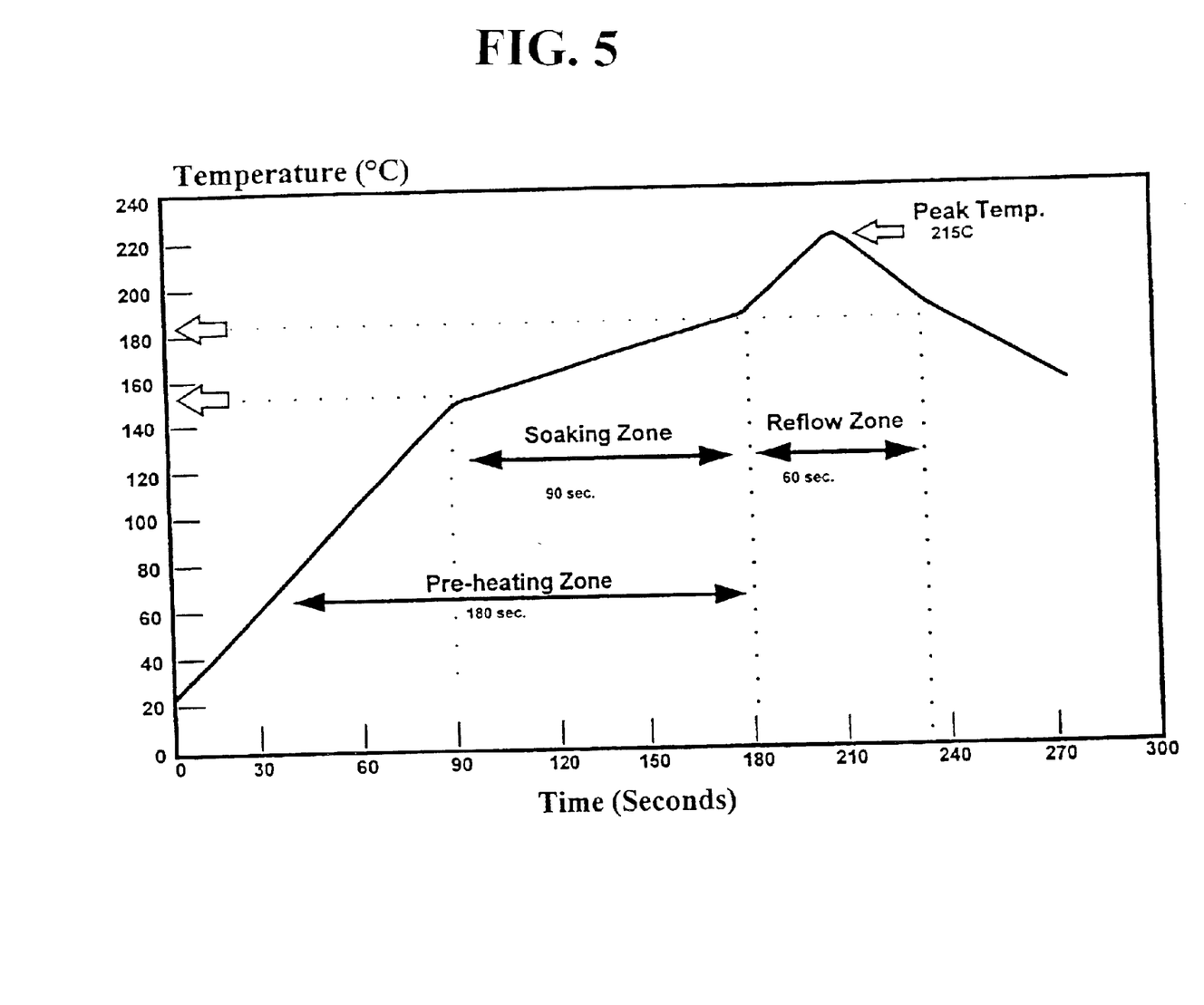
FIG. 5 is the specific profile referred to in Example 4.

This same mixture was then spread onto the metal surface of an FR-4 epoxy glass substrate plated with copper along with a slug of 63Sn/37Pb solder. The substrate, containing the epoxy composition and the solder slug, was placed into an IR reflow oven with multiple heating zones. The temperatures of the zones and the belt speed of the oven had previously been profiled to yield substrate surface temperature profile as shown in FIG. 5.

Using this temperature profile the solder slug did not wet the copper surface on the FR-4 and form a metallurgical connection. Instead the solder slug remained in its original shape and was encapsulated in the cured epoxy.

Figure 6:
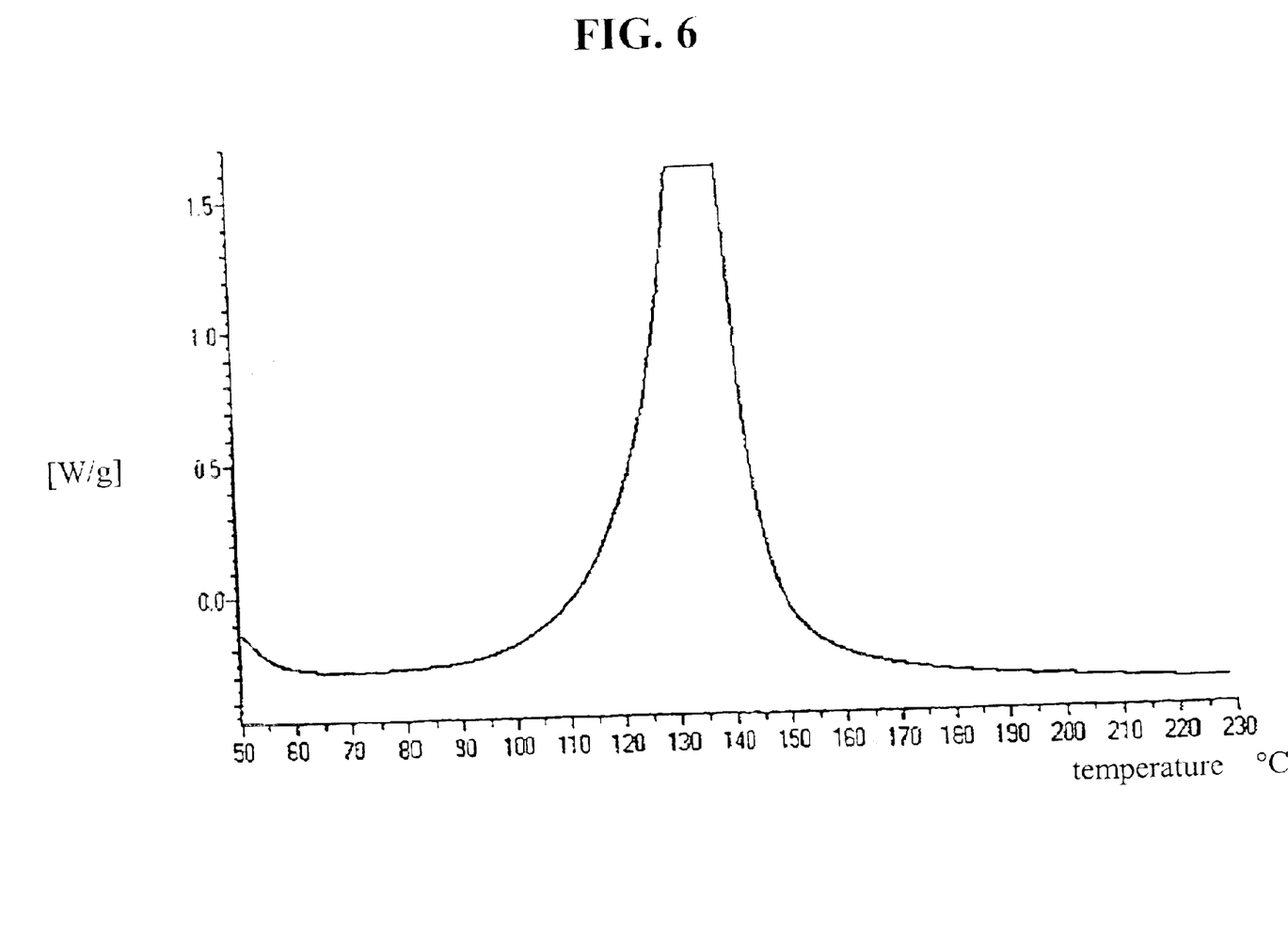
FIG. 6 is a graphic representation charting heat change versus temperature of the encapsulant described in Example 1.

In addition to the empirical soldering tests described above, DSC was used to examine the cure kinetics of the above epoxy. Using a 50 mg sample and a heating rate of 10° C./min from 50° C. to 230° C., the onset of the cure exotherm was observed at 100° C. while the peak exotherm was observed at 130° C., as shown in FIG. 6. Therefore, using a heating rate of 10° C./min., the maximum exotherm of the cure reaction occurs 50° C. below the melting point of the solder.

EXAMPLE 5

Using the same resin and anhydride combination as in Example 4, Lonza ACPI (a proprietary imidazole) was used as a catalyst.

| | |
|---|---|
| Epon 828 | 55 parts |
| MTHPA | 43 parts |
| ACPI | 2 parts |

This mixtures was used with solder slugs heated rapidly on copper. The anhydride cleaned the metal oxides and the solder wet and spread onto, the copper surface. When the composition was spread onto copper over FR-4 organic substrate and heated in the multiple zone heating oven, however, the result was the same as described in Example 4. The solder did not change shape and did not spread onto the metal surface.

The DSC scan from 50° C. to 230° C. at 10° C./min on a 50 mg sample showed the exotherm onset to begin at 100° C. and peak at 130° C. Again, although rapidly heating the combination of materials allowed the solder to spread onto the copper, when heated slowly to solder melt point using a multiple zone oven the epoxy system described did not have the necessary latency to remain liquid before soldering.

Similar results were observed using the Epon 828 and MTHPA combination with several other known anhydride cured epoxy catalysts, including Dimethylaminomethylphenol (Lonza AC-10), zinc octoate (Shepard Chemicals), Benzyldimethylamine (Lonza BDMA), Diazabicycloundecene (Air Products Amicure DBU-E), 2-ethylhexanoic acid salt of Diazabicycloundecene (Air Products Amicure SA-102), 2-heptadecylimidazole (Air Products Curezol 2MA-OK), 2-Heptadecylimidazole (Air Products C17Z), 2,4-Diamino-6(2'methylimidazoleyl-(1'))ethyl-s-tri (Air Products 2MZ Azine).

In each case the catalyst was used with a bisphenol A resin (EEW 190) such as Shell Epon 828 and Methyl Tetrahydrophthalic anhydride at 80 parts based on the weight of the resin. Using the catalysts stated above at 1–5 parts based on the weight of the resin, the mixtures were found to clean the metal oxides and promote spreading of 63 Sn/37 Pb solder to copper when heated rapidly, but cured too quickly and inhibited soldering when heated slowly in a multizone conveyorized heating oven as described in Example 4.

EXAMPLE 6

Stannous octoate (Ferro Bedford Catachek 860) was selected as a catalyst for the bisphenol A resin, MTHPA composition as described in example 1.

| | |
|---|---|
| Epon 828 | 55 parts |
| MTHPA | 43 parts |
| Stannous octoate | 2 parts |

This mixture was used with solder slugs heated rapidly on copper. The anhydride cleaned the metal oxides and the solder wet and spread onto the copper surface. When the composition was spread onto copper over FR-4 organic substrate and heated in the multiple zone heating oven, the solder spread onto the metal surface of the copper and the epoxy was partially gelled. Thus the catalyst selection with this combination of resin and crosslinking agent provided the latency for gelation to take place after soldering.

Figure 7:
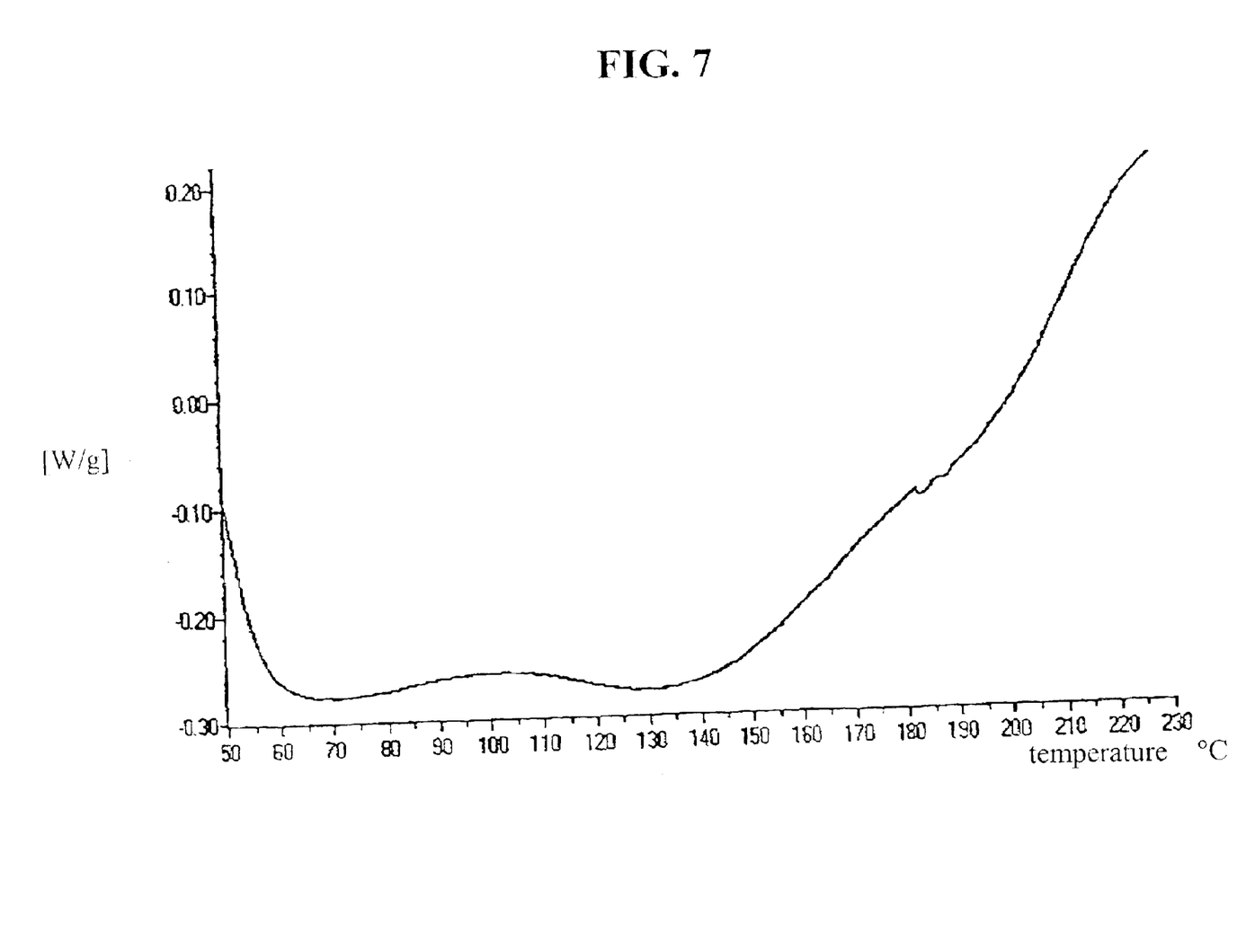
FIG. 7 is a graphic representation charting heat change versus temperature of the encapsulant described in Example 4.

The DSC scan from 50° C. to 230° C. at 10° C./min on a 50 mg sample showed the exotherm onset to begin at 150° C. and peaked well above 200° C., as shown in FIG. 7. Thus, the peak exotherm, which is used to predict latency, occurs well above the solder melt point of 183° C.

EXAMPLE 7

Using stannous octoate as a catalyst with MTHPA along with a multifunctional resin such as N,N,N',N'-Tetraglycidal-4,4'-methylenebisbenzenamine (Ciba Geigy MY720). This tetra-functional resin has a higher reactivity than one based on bisphenol A. A mixture of MY720 with MTHPA at 90% of the stoichiometric ratio was prepared with stannous octoate used as the catalyst and added at 1 part based on the weight of the resin.

| | |
|---|---|
| MY 720 | 45 |
| MTHPA | 54 |
| Stannous octoate | 1 |

Using this composition in the rapid heating method described in Example 1 the solder spread and formed a metallurgical connection to the copper. However, when using the heating method involving the multizone oven the solder did not spread or wet onto the copper. Eliminating the stannous octoate and using the MY70/MTHPA combination described showed the same result. The solder was inhibited from wetting the copper when heating the sample in the multizone oven.

When cycloaliphatic resins such as 3,4-Epoxycyclohexylmethyl-3,4-epoxycyclohexane carboxylate (Union Carbide ERL-4221) are used in combinations with MTHPA are used with stannous octoate as the catalyst the soldering result observed is similar to Example 1. The composition cures before solder melt point and inhibits the spread of the solder to the copper.

A DSC scan of the composition:

| | |
|---|---|
| ERL-4221 | 49 parts |
| MTHPA | 49 parts |
| Stannous Octoate | 2 parts | at a heating rate of 10° C./min showed the exotherm onset at 90° C. with a peak exotherm at 155° C. Thus, the exotherm peak, which correlates to the chemical reaction rate, is lower than the melting point of the solder alloy.

A blend of epoxy resins Epon 828 and ERL 4221 was used with MTHPA and stannous octoate as a catalyst.

| | |
|---|---|
| ERL-4221 | 24.5 |
| Epon 828 | 24.5 |
| MTHPA | 49 |
| Stannous Octoate | 2 |

This system solder soldered 63 Sn/37 Pb alloy to copper when heated rapidly but did not solder using the multizone heating oven. The DSC onset temperature began at a higher temperature of 120° C. compared to the composition using only the cycloaliphatic resin (ERL-4221). Although the peak exotherm was nearly identical in temperature to the single resin system yet the height of the exotherm was lower with the resin blend system indicating less heat given off and therefore less chemical activity. Thus, blends of highly reactive resins such as cycloaliphatic resins with MTHPA do not provide the necessary latency.

EXAMPLE 8

A blend of bisphenol A system, MTHPA and a dicyandiamide type catalyst (Ajinomoto Ajicure AH-150) was used at various catalyst levels.

| | |
|---|---|
| Epon 828 | 52–56 parts |
| AH-150 | 40–43 parts |
| AH-150 | 1–8 parts |

Using catalyst levels of 1–2 parts based on the weight of the resin were found to solder the 63 Sn/37 Pb alloy both using rapid heating as well as using the multizone oven. However, when used at concentrations above 3 parts based on the weight of the resin the compositions inhibited the solder from spreading using the multi-zone heating profile. Thus, the catalyst level is critical to the rate of reaction. DSC exotherms revealed that the onset of the peak exotherm occurs at lower temperatures as catalyst concentration increases.

The Reflow Profile

The cross-linking catalyst (accelerator) selection is based on the need to inhibit gelation during the soldering process. A most important embodiment of the present invention involves the soldering method known as reflow soldering. In reflow soldering, the components to be soldered to the circuit board or substrate are placed onto the PCB or substrate and such assembly is passed through an oven containing different heating zones. Three zones are typical. The first zone, or heating stage, is commonly called the ramp. In this zone, the surface temperature of the board is quickly raised to heat the materials of the board and components. In the second zone, known as the soak, the temperature of the board is allowed to equalize at this temperature range for a period of time that may be of short duration (1–3 minutes) in order to reduce temperature differentials on the surface of the board and components. The soak time will depend on the type of board, solder and components used. The third step involves a quick temperature spike to exceed the solder melt point. Therefore, the solder melting temperature dictates the temperatures of the zones. Since melting point of 63 Sn/37 Pb is 183° C., the soak temperature is generally 120–160° C. The peak temperature at reflow is generally 200–300° C.

Catalyst

When the encapsulant of the present invention includes a catalyst, the selection of the catalyst is critical and is based on the ability of the catalyst in the epoxy system to catalyze the cross-linking to the point of gelation (gel point) during or after the reflow process, without inhibiting reflow soldering.

By way of explanation, an uncatalyzed combination of a bisphenol A resin combined with a phthalic anhydride derivative, such as MTHPA, when used in a reflow soldering process, would not inhibit soldering but would also not reach its gel point during the reflow process. Such systems would require 6–48 hours of post-cure below soldering temperature (typically 150° C.) in order to reach gelation and fully cross-link. Therefore, a catalyst is necessary to reduce the overall time of cure of these systems. However, it has been observed that, if a catalyst is selected which is too active, the system will reach gelation below the soldering temperature and inhibit the soldering process by forming a physical barrier between solder and target metal.

Anhydride catalysts of the amine type have shown this detrimental phenomenon. Examples of unacceptable catalysts are benzyldimethylamine dimethylamino methyl phenol, tris (dimethylamino methyl) phenol, triethanolamine and monoethanolamine. When these amines are used as catalysts together with bisphenol A epoxy resins, such as shell EPON 828, and phthalicanhydride derivatives such as MTHPA using the standard reflow protocol, premature gelation results which inhibits proper soldering.

Other common anhydride-cured epoxy catalysts have been shown to be detrimental to soldering, as detailed in Example 5, when using blends of bisphenol A resins and MTHPA.

Tin octoate, the catalyst of choice for these systems, is a metal salt of tin and 2-ethylhexoic acid. Although not wishing to be bound, it is believed that the activity of the catalyst arises from the oxidation of the tin from $Sn^{+2}$ to $Sn^{+4}$ and the dissociation of the tin from the 2-ethylhexoic acid. When tin octoate is tested using differential scanning calorimetry, an exotherm is observed at 185–190° C. It has been observed and therefore it is believed that the temperature at which the exotherm occurs correlates to the temperature at which catalysis of cross-linking occurs. Accordingly, one method of evaluating onsets of catalytic activity where the mechanism of catalysis of the catalyst being evaluated corresponds to that of tin octoate is to correlate the exotherm of the catalyst with the temperature at which catalysis of cross-linking occurs.

When used in combinations with MTHPA and bisphenol A resins stannous octoate has been shown to effectively provide the required latency necessary to prevent premature gelation of polymer before soldering.

The choice of stannous octoate as an accelerator (cross-linking catalyst) prevents significant gelation of the epoxy during the ramp and soak stages to allow the soldering to take place when using a reflow temperature profile for Sn/37 Pb solder or alloys with similar melting points.

Another example of a suitable encapsulant, comprises (1) an epoxy resin, diglycidal ether of bisphenol A with an epoxy equivalent weight of 185–192, (2) MTHPA cross-linking and fluxing agent and (3) tin octoate catalyst. The cross-linking agent is an anhydride cross-linking agent which also acts as fluxing agent. The MTHPA cross-linking agent is paired with tin octoate catalyst that catalyzes cross-linking at a temperature at or above about the soldering temperature, thereby preventing premature gel formation prior to formation of the electrical connection(s) during reflow soldering.

The amount of catalyst in the composition preferably ranges from about 0.1 to about 10 weight % based on total weight of encapsulant. In the case of tin octoate, the preferred amount is from about 2.5 to about 7 weight percent and the optimal amount is about 5 weight % based on the total weight of the encapsulant.

Optional Additives

A component which can optionally and advantageously be included in the encapsulant of the present invention is a surface tension reducing agent. It is used to reduce the contact angle at the bonding surfaces. The surface tension reducing agent may be a surfactant. Among the suitable surfactants are TWEEN®, available from ICI, Wilmington, Del., and potassium perfluoroalkyl sulfonates. When present, the surface tension reducing additive is preferably added in amounts of from about 0.1 weight % to about 1 weight % based on the total weight of encapsulant.

Another component that optionally is added to the encapsulant composition of the present invention is an adhesion promoter which has the ability to enhance epoxy to metal bonding. Suitable adhesion promoters include organo silanes and titanates. A suitable organosilane is 6040, 3-glycidoxy-propyltrimethoxysilane available from Dow Corning Corp. of Midland, Mich. A suitable titanate is LICA 38, neopentyl (diallyl)oxy, tri(diooctyl)pyrophosphatotitinate available from Kenrich Petro Chemicals, Inc., in Bayonne, N.J. The adhesion promoter is preferably added in amounts of from about 0.1 weight % to about 1% weight % based on the total weight of the encapsulant.

Yet another component that can optionally be used in the encapsulating composition of the present invention is a defoaming agent such as FOAM BLAST™ 1326, an alkoxylate of fatty esters available from Ross Chemicals. The defoaming agent is preferably added in amounts of from about 0.1 weight % to about 1 weight % based on total weight of based on the total weight of the encapsulant.

It is not intended to limit the encapsulant, surface mount reflow soldering method of manufacture, encapsulant selection and composition and assemblies of the present invention to the particular embodiments described herein, and various modifications may be made, including, but not limited to, changes in the surface mount reflow profiles based on variations in the solder and hence solder melt temperature and conditions of solder melt, the dimensions, shape and materials, without departing from the scope and spirit of the invention as set forth in the following claims.

What is claimed is:

1. A method of forming an electrical assembly by encapsulating and electrically connecting with solder an electrical component having a plurality of metal bond site terminations to a component carrying substrate having a plurality of metal attachment sites corresponding to the terminations of said electrical component, with an encapsulant comprised of a thermosetting resin and a cross-linking agent that acts, below the solder melt temperature, as a fluxing agent which removes oxide coatings from the surface of the metal bond sites on said electrical component and on said component carrying substrate when heated to said solder melt temperature, said thermosetting resin and said cross-linking agent combination having a gel point at or above said solder melt temperature, which method comprises the steps of:
   a. removing oxide coating from the surface of said metal bond sites while said encapsulant is in liquid form;
   b. melting the solder to electrically connect the electrical component having a plurality of metal bond site terminations to the component carrying substrate having a plurality of metal bond site terminations corresponding to the terminations of said electrical component while said encapsulant is in liquid form and prior to said encapsulant reaching its gel point; then
   c. forming an encapsulant gel; and then
   d. curing said gel.

2. The method of claim 1 wherein the thermosetting resin is an epoxide.

3. The method of claim 1 wherein the cross-linking agent is a polyanhydride or a carboxy terminated polyester.

4. The method of claim 2 wherein the cross-linking agent is a polyanhydride or a carboxy terminated polyester.

5. A method of producing a low thermal mass assembly by electrically connecting with solder an electrical component having a plurality of metal bond site terminations to a component carrying substrate having a plurality of metal attachment sites corresponding to the termination of said electrical component with an encapsulant comprised of a thermosetting resin and a cross-linking agent that acts, below the solder melt temperature, as a fluxing agent which removes oxide coatings from the surface of the metal bond sites on said electrical component and on said component carrying substrate when heated to said solder melt temperature, said thermosetting resin and said cross-linking agent combination having a gel point at or above said solder melt temperature, which method comprises ramping said low thermal mass assembly at the rate of about 1° C. to about 4° C. per second for a time sufficient to achieve solder melt and electrical interconnection and during said ramping effecting the steps of:
   a. removing oxide coating from the surface of said metal bond sites while said encapsulant is in liquid form;
   b. melting the solder to electrically connect the electrical component having a plurality of metal bond site terminations to the component carrying substrate having a plurality of metal bond site terminations corresponding to the terminations of said electrical component while said encapsulant is in liquid form and prior to said encapsulant reaching its gel point; then
   c. forming an encapsulant gel; and then
   d. curing said gel.

6. The method of claim 5, wherein the thermosetting resin is an epoxide.

7. The method of claim 5, wherein the cross-linking agent is a polyanhydride or a carboxy terminated polyester.

8. The method of claim 6 wherein the cross-linking agent is a polyanhydride or a carboxy terminated polyester.

9. An electrical component assembly comprising:
- an electrical component having a plurality of electrical terminations, each termination including a solder bump;
- a component carrying substrate having a plurality of electrical terminations corresponding to the terminations of the electrical component;
- an encapsulant forming material that removes oxide coatings from the component plurality of electrical terminations and the substrate plurality of electrical terminations when heated to a soldering temperature, comprising:
- a thermosetting resin;
- a catalyst; and
- a cross-linking agent that functions as a fluxing agent to remove said oxide coatings form said component terminations and said substrate terminations when heated to said soldering temperature and, in the presence of a catalyst, reacts with said resin at surface mount reflow profile conditions to form a gel at or above said soldering temperature,
- the encapsulating material disposed between and bonding the electrical component and the substrate; the solder bump being reflowed and electrically connecting the electrical component to the substrate.

10. The electrical component assembly of claim 9, wherein the thermosetting resin is an epoxy resin and the cross-linking agent is an anhydride.

11. The electrical component assembly of claim 10, wherein the anhydride is selected from the group consisting of succinic anhydride, methyltetrahydrophthalic anhydride, polyadipic polyanhydride, tetrahydrophthalic anhydride, hexahydrophthalic anhydride, polyazelaic polyanhydride and admixtures thereof.

12. The electrical component assembly of claim 10, wherein the epoxy resin is [DGEBA] Diglycidyl ether of Bishenol A resin or novolak resin.

13. An electrical component assembly, comprising:
- an electrical component having a plurality of electrical terminations, each termination including a solder bump;
- a component carrying substrate having a plurality of electrical terminations corresponding to the terminations of the electrical component;
- an encapsulant forming material that removes oxide coatings from the component plurality of electrical terminations and the substrate plurality of electrical terminations when heated to a soldering temperature, comprising:
- a thermosetting resin;
- a catalyst; and
- a cross-linking agent that functions as a fluxing agent to remove said oxide coatings form said component terminations and said substrate terminations when heated to said soldering temperature and, in the presence of a catalyst, reacts with said resin to form a gel at or above said soldering temperature at surface mount reflow profile conditions the peak exotherm of said mixture of catalyst, thermosetting resin and cross-linking agent as measured using DSC at a ramp rate of 10° per minute being at or about the solder melting point whereby the gel point of said cross-link thermosetting resin is reached at solder melt wherein the exothermic activity as measured using DSC is initiated at a temperature no lower than 40° below the solder melting point.

* * * * *